(12) United States Patent
Riley et al.

(10) Patent No.: US 12,283,787 B2
(45) Date of Patent: Apr. 22, 2025

(54) MODULAR COMPACT HIGH ENERGY LASER SYSTEM

(71) Applicant: Booz Allen Hamilton Inc., McLean, VA (US)

(72) Inventors: Jennifer Riley, Fredericksburg, VA (US); Edward Merryman, Fredericksburg, VA (US); Joseph Shepard, Fredericksburg, VA (US)

(73) Assignee: Booz Allen Hamilton Inc., McLean, VA (US)

(*) Notice: Subject to any disclaimer, the term of this patent is extended or adjusted under 35 U.S.C. 154(b) by 934 days.

(21) Appl. No.: 17/391,237

(22) Filed: Aug. 2, 2021

(65) Prior Publication Data

US 2023/0170661 A1 Jun. 1, 2023

(51) Int. Cl.
| | | |
|---|---|---|
| H01S 3/04 | (2006.01) | |
| H01S 3/067 | (2006.01) | |
| H01S 3/094 | (2006.01) | |
| H01S 5/024 | (2006.01) | |

(52) U.S. Cl.
CPC ........ *H01S 3/0404* (2013.01); *H01S 3/06754* (2013.01); *H01S 3/094* (2013.01); *H01S 5/02469* (2013.01); *H01S 3/094003* (2013.01)

(58) Field of Classification Search
None
See application file for complete search history.

(56) References Cited

U.S. PATENT DOCUMENTS

| | | | |
|---|---|---|---|
| 10,074,954 B1* | 9/2018 | Burkholder | H01S 3/0407 |
| 11,561,030 B1* | 1/2023 | Vaisman | F25B 1/00 |
| 2007/0147442 A1* | 6/2007 | Kumkar | B23K 26/0643 |
| | | | 372/6 |
| 2012/0155498 A1* | 6/2012 | Sakamoto | H01S 3/06754 |
| | | | 372/6 |
| 2015/0110136 A1* | 4/2015 | Schusslbauer | H01S 3/06754 |
| | | | 372/6 |
| 2016/0235980 A1* | 8/2016 | Berman | A61B 5/377 |
| 2022/0412700 A1* | 12/2022 | Sipes, Jr. | F41H 13/005 |

\* cited by examiner

*Primary Examiner* — Eric L Bolda
(74) *Attorney, Agent, or Firm* — Fish & Richardson P.C.

(57) ABSTRACT

Described is a directed energy system that has a compact and modular configuration and that enables movement/assembly by a two-user team. The directed energy system includes one or more high-power laser sources that house one or more high-power fiber amplifiers, a beam combiner optically coupled to the one or more high-power laser sources, a beam director coupled to the beam combiner, a command and control module configurable to control operation of the one or more high-power fiber amplifiers. The directed energy system also includes a handheld controller with an integrated monitor, the handheld controller configurable to send control signals to the handheld controller module to control operation of the handheld controller module and a power module that includes batteries and power converters that provide electrical power required to run the directed energy system. Cooling of the directed energy system is performed only by ambient air contacting the directed energy system and without application of any external coolant medium to the system.

18 Claims, 8 Drawing Sheets

MODULAR COMPACT HIGH ENERGY LASER SYSTEM

BACKGROUND

High energy laser systems employ high heat flux loads, such as laser diodes, that are highly temperature sensitive. These laser diodes are often cooled with conventional closed-cycle refrigeration systems. Cooling of high heat flux loads typically involves circulating refrigerant fluid at a relatively high mass flow rate. The closed-circuit refrigeration system components required by such high energy laser systems include relatively large and heavy compressors to compress vapor at a low pressure to vapor at a high pressure and relatively large and heavy condensers to remove heat from the compressed vapor. In addition to being large and heavy these components typically consume significant amounts of electrical power.

Closed-circuit refrigeration systems may not be well-suited for deployment in mobile platforms—such as on small vehicles—where size and weight constraints may make the use of large compressors and condensers impractical. Some temperature sensitive loads such as electronic components and devices may require temperature regulation within a relatively narrow range of operating temperatures. Closed-circuit refrigeration systems are particularly unsuitable for small, lightweight systems that are not affixed to a permanent surface, such as truck, ship or an aircraft.

SUMMARY

According to an aspect, a directed energy system (system) has a compact and modular configuration and that enables movement/assembly by a two-user team and includes one or more high-power laser sources that house one or more high-power fiber amplifiers. The system also includes a beam combiner optically coupled to the one or more high-power laser sources, a beam director coupled to the beam combiner, a command and control module configurable to control operation of the one or more high-power fiber amplifiers, and a handheld controller with an integrated monitor. The handheld controller is configurable to send control signals to the command and control module to control operation of the system. The system further includes a power module that includes batteries and power converters that provide electrical power required to run the directed energy system. Cooling of the directed energy system is performed only by ambient air contacting the directed energy system and without application of any external coolant medium to the system.

Embodiments of the directed energy systems may include any one or more of the following features or other features disclosed herein.

Pairs of the high-power fiber laser amplifiers are housed two high-power fiber amplifiers per high-power laser source.

The one or more laser sources are four laser sources with a total of eight fiber laser amplifiers packaged in four cases. The one or more laser sources include output optical fibers that optically couple the one or more laser sources into the beam combiner.

The beam combiner is coupled to the beam director.

The beam combiner and the beam director are packaged as a phased array beam director that moves in azimuth and elevation, and that includes sensors such as cameras and a rangefinder supported on a yoke and a tripod.

The command and control module includes a computer device, a low-power seed laser, and a power distribution network. The computer device causes the system to operate at a high-power output when commanded from the handheld controller by the user, and then transitions to a standby mode disabling optical output, when commanded from the handheld controller by the user or automatically if an error is detected.

The system includes a solid state fiber laser, and the system is configured to output an output beam of up to 10 kW (nominally).

According to an additional aspect, a method of cooling a directed energy system (system) that has a compact and modular configuration and that enables movement/assembly by a two-user team, with the method including assembling one or more high-power laser modules that house one or more high-power fiber amplifiers, with a beam combiner that optically couples to the one or more high-power laser modules, that are arranged on a beam director that is coupled to the beam combiner with a command and control module and a power module that includes batteries and power converters that provide electrical power required to run the directed energy system, controlling operation of the one or more high-power fiber amplifiers with a handheld controller having an integrated monitor, the handheld controller configurable to send control signals to the command and control module to control operation of the command and control module, and cooling the directed energy system only by ambient air contacting the directed energy system, without application of any external coolant medium to the system.

Embodiments of the directed energy systems may include any one or more of the following features or other features disclosed herein.

Each of the one or more high-power laser sources includes one or more banks of high-power laser diodes associated with a pair of the high-power fiber laser amplifiers that are housed two high-power fiber amplifiers per high-power laser source.

The one or more laser sources are four laser sources with a total of eight fiber laser amplifiers packaged in four cases.

The method further includes optically coupling the one or more laser sources into the beam combiner.

The method further includes moving the beam director in azimuth and elevation.

The method further includes causing by the handheld controller, operation at a high-power output for a fixed interval of time, and then automatically transitioning to a standby mode.

The method further includes causing by the handheld controller, operation at a high-power output, and transitioning to a standby mode, upon receiving a signal to halt high-power operation.

The method further includes outputting a 10 kW (nominally) output beam.

One or more of the above aspects may include one or more of the following advantages.

The aspects enable production of a compact and modular directed energy system that enables movement and/or assembly by a two-person team. The directed energy systems include modules that can optimize and/or scale per mission. The directed energy systems are transportable being housed in ruggedized cases with exterior interconnects, and operate with uncooled operation, i.e., no thermal management infrastructure is needed. The aspects use handheld controls for one-person operation.

As a result, the use of closed-circuit refrigeration systems is avoided, making the above aspects suitable for portable deployment where size and weight constraints may make the use of large compressors and condensers impractical.

The details of one or more embodiments are set forth in the accompanying drawings and the description below. Other features and advantages will be apparent from the description, drawings, and claims.

DETAILED DESCRIPTION

Cooling of high heat flux loads that are also highly temperature sensitive can present a number of challenges. This is especially true for portable, i.e., human carried, high heat flux loads that are not permanently attachable to a larger platform, be it a truck or a ship or in space. The system described below generates significant quantities of heat. The system nevertheless operates uncooled by any cooling system. This avoids the need for the conventional closed-circuit refrigeration systems that include large compressors to compress vapor at a low pressure to vapor at a high pressure and condensers to remove heat from the compressed vapor at the high pressure and convert to a liquid. These components are typically heavy and consume significant power. As a result, closed-circuit systems are not well-suited for deployment in portable applications such as non-permanently fixed applications, where size and weight constraints make the use of compressors and condensers impractical.

Figure 1:
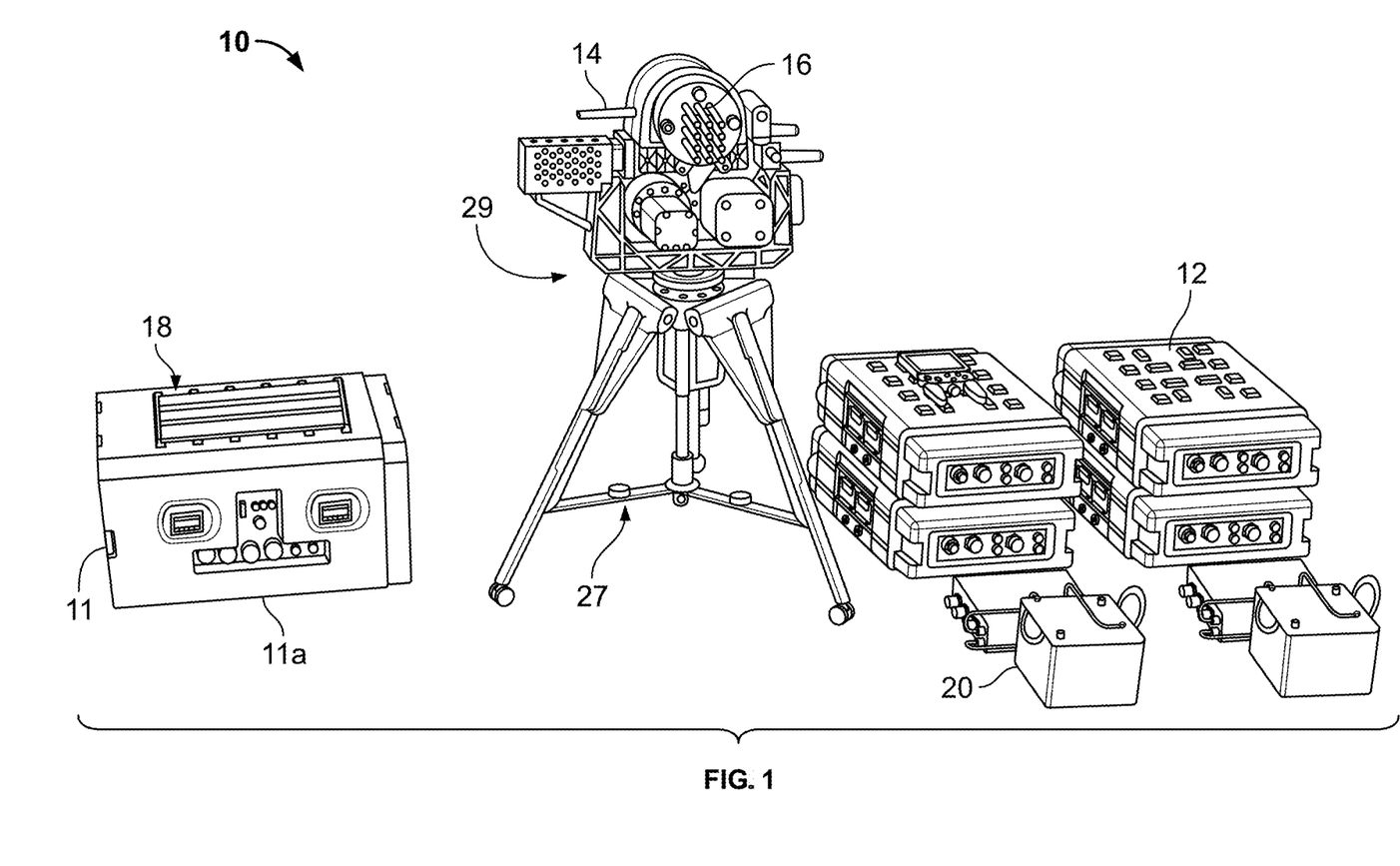
FIG. 1 is a schematic diagram of an example of a portable, directed energy system that is not permanently attached to a larger platform, and which operates without refrigeration, i.e., a cooling system.

Referring to FIG. 1, a directed energy system (DES) 10 includes a seed laser source 11a contained within a ruggedized case 11, and which is optically coupled to one or more high-power laser modules 12, with the high-power laser modules 12 each having an output that is optically coupled to a beam combiner 14. The beam combiner 14 is affixed to a beam director 16. Each high-power laser module 12 is packaged in a case 12c. The case 12c includes multiple banks of high-power laser diodes (see FIG. 6) coupled to a pair of high-power fiber laser amplifiers (see FIG. 6). In this embodiment there are two high-power fiber laser amplifiers 12 per case 12c and a total of eight high-power fiber laser amplifiers 12 packaged in four such cases 12c. The high-power laser module 12 also includes output fibers that insert into the beam combiner 14. No cooling of the high-power laser modules 12 is required to meet operational requirements. The beam combiner 14 and the beam director 16 are a phased array, with the beam director 16 movable in azimuth and elevation. The beam director 16 also includes sensors such as cameras and a rangefinder. The beam combiner 14 and the beam director 16, i.e., "payload assembly and yoke 29" are attachable to and detachable from a tripod 27 for ease of assembly and transport.

Figure 6:
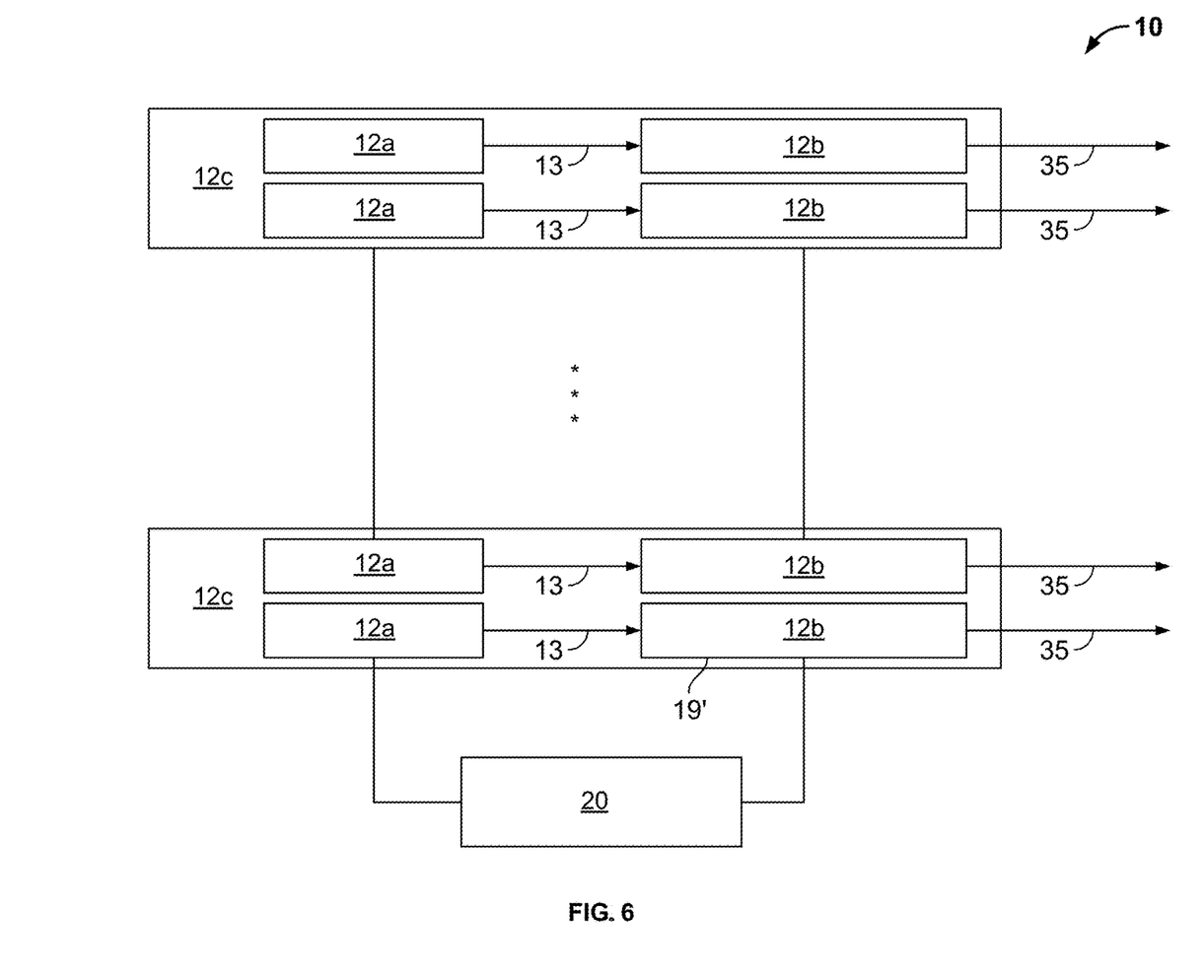
FIG. 6 is a diagram showing a high-power laser source including a plurality of high-power fiber amplifiers.

Physical and graphical operator interfaces (not shown) are provided by a ruggedized handheld controller 18 with an integrated monitor. The handheld controller 18 connects to the command and control module 11 that contains a computer device, the seed laser 11a, e.g., a low-power laser (and associated components), and a power distribution network. The low-power laser components are low-powered relative to the much higher-powered high-power laser diodes (FIG. 6).

The DES 10 also includes a power module 20 that includes batteries and power converters that provide electrical power required to run the DES 10 with no external connections required during DES 10 operation. External connections (not shown) are provided for recharging the batteries. The batteries can be pre-tested to meet military standards for safety and transport. In this embodiment there are two power modules 20, one per pair of high-power laser modules 12.

Figure 2A:
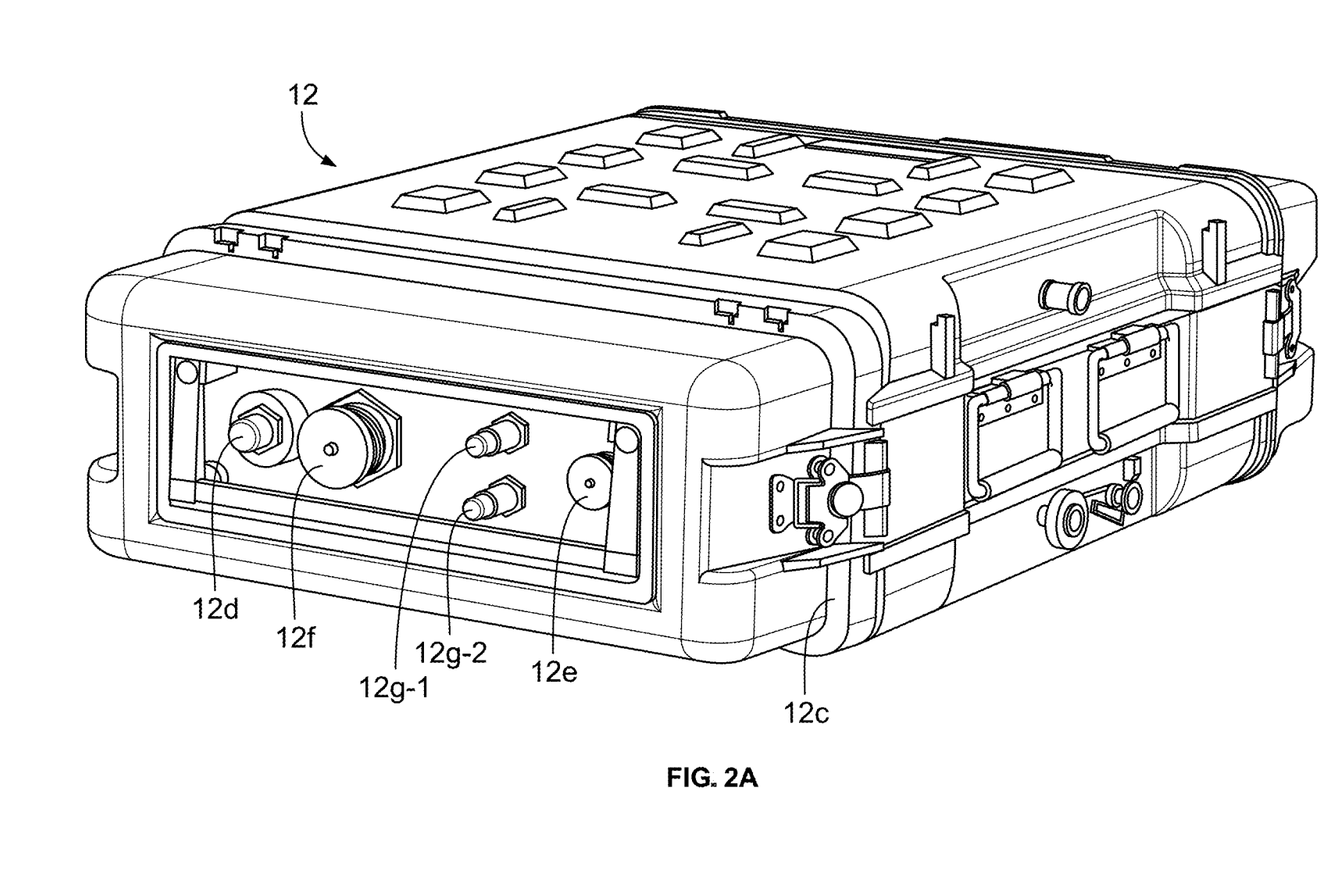
FIG. 2A is a diagram showing a high-power laser source.

Referring now to FIG. 2A, an exemplary high-power laser module 12 is shown. The high-power laser module 12 includes banks of laser diodes (not shown) in a pair of high-power fiber laser amplifiers that are housed in a case 12c. A total of eight high-power fiber amplifiers are packaged in four of the cases 12c. The cases 12c for the high-power laser modules 12 are ruggedized, meaning that the cases 12c are capable of operation without cooling of the high-power fiber amplifiers within each of the cases 12c over a designated period of time. While the high-power laser module 12 satisfies mission requirements without the need for external cooling, optional cooling channels could be provided to meet additional or future requirements for other mission requirements.

The case 12c includes an optical inlet port 12d, an optical output port 12e, and a power inlet 12f, as well as the optional cooling channels for a cooling medium, e.g., inlet 12g-1 and outlet 12g-2. While the DES 10 uses four cases 12c, fewer or more cases 12c could be used to meet different output power requirements.

Figure 2B:
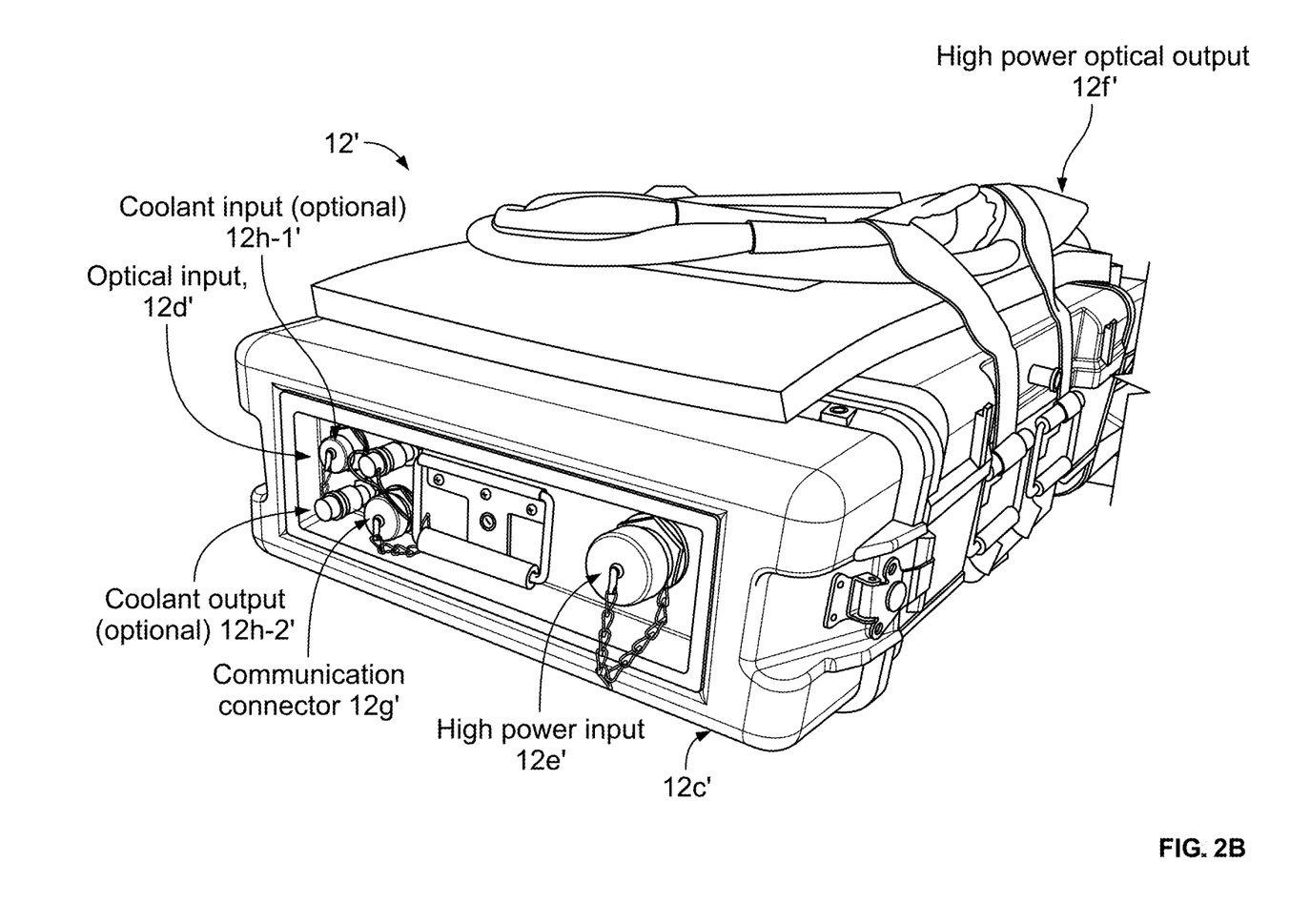
FIG. 2B is a diagram showing details of an alternate high-power laser source.

Referring now to FIG. 2B, an alternative high-power laser module 12' is shown. The alternative high-power laser module 12' includes the bank of high-power laser diodes (not shown) and the pair of high-power fiber laser amplifiers (not shown) that are housed in an alternative case 12c'. A total of eight amplifiers are packaged in four cases 12c' (two amplifiers per case 12c'). The cases 12c' for the high-power laser source 12' are ruggedized, meaning that the cases 12c' are capable of operation without cooling of the fiber amplifiers within the cases 12c' over a designated period of time.

While the high-power laser module 12' satisfies mission requirements without the need for external cooling, optional cooling channels could be provided to meet additional or future requirements for other mission requirements. The case 12c' includes an optical inlet 12d', a high power optical input 12e', a high power optical output 12f, a communication connector 12g', as well as, optional channels for a cooling inlet 12h-1' and a cooling outlet 12h-2'. While the DES 10 uses four cases 12c', fewer or more cases 12c' could be used to meet different output power requirements.

Figure 3A:
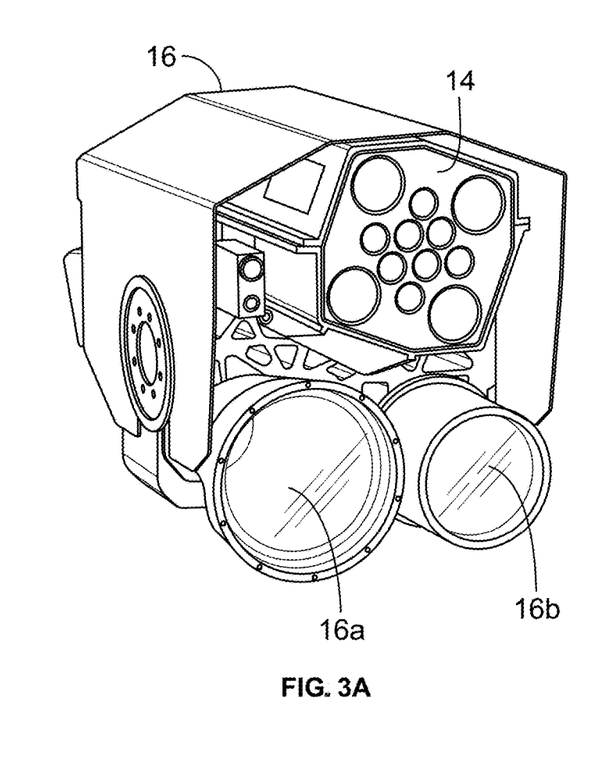
FIG. 3A is a diagram showing a beam combiner and a beam director.
Figure 3B:
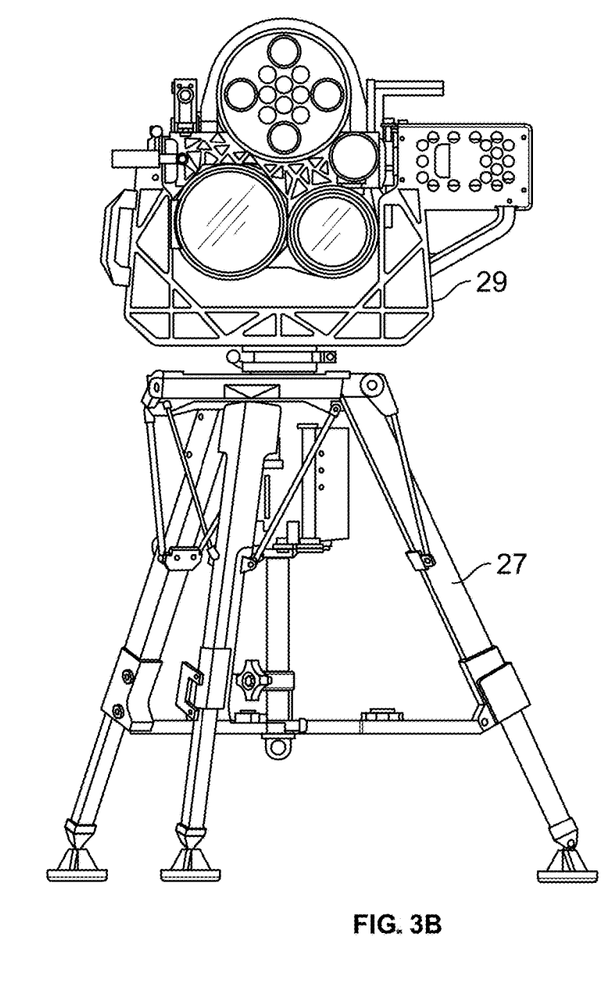
FIG. 3B is a diagram showing the beam combiner and the beam director affixed to a tripod.

Referring now to FIGS. 3A, 3B, the beam combiner 14 (e.g., laser array) and the beam director 16 are shown. The beam combiner 14 is built within the beam director 16. The beam director 16 is mounted on a tripod 27 that includes a yoke 29. The tripod 27 and yoke 29 permit the beam director 16 to move in azimuth and elevation directions. The beam director 16 also includes cameras 16*a* and a range finder 16*b* in addition to the beam combiner 14 implemented as a phased array, to output the high-energy beam. The beam director 16 encompasses the remainder of the view in FIGS. 3A and 3B. That is, the beam director 16 also includes the sensors (e.g. camera 16*a* and range finder 16*b*, etc.) and the yoke 29 that functions as a positioner, which together with the tripod 27 allows for target acquisition and pointing of the beam former 14. The azimuth drive can be built into the tripod 27.

Figure 4A:
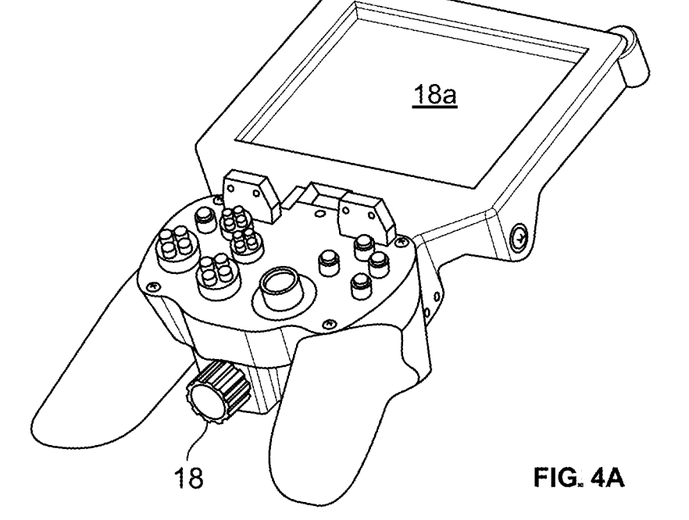
FIG. 4A is a diagram showing a handheld controller.
Figure 4B:
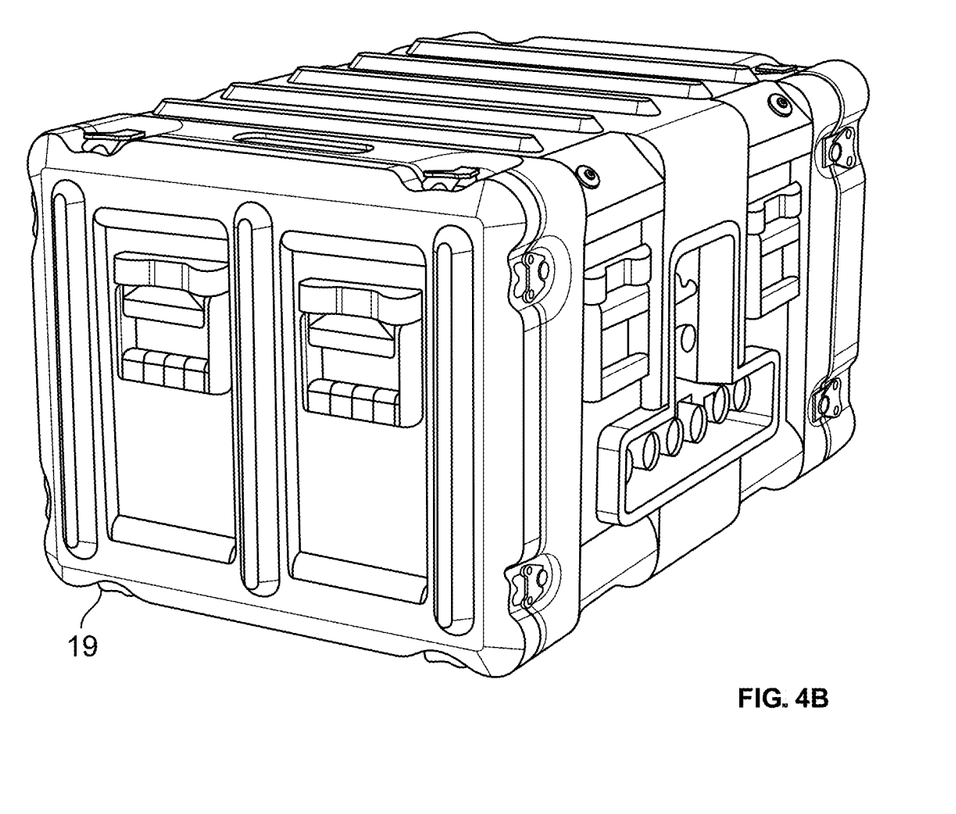
FIG. 4B is a diagram showing a command and control module.

Referring now to FIGS. 4A, 4B, the ruggedized handheld controller 18 (FIG. 4A) with an integrated 6.4" monitor 18*a* is shown. The handheld controller 18 connects to the command and control case 11 (FIG. 4B) that contains the computer device, low-power laser components, and power distribution network. The handheld controller 18 operation will be further discussed in conjunction with FIG. 7.

Figure 5:
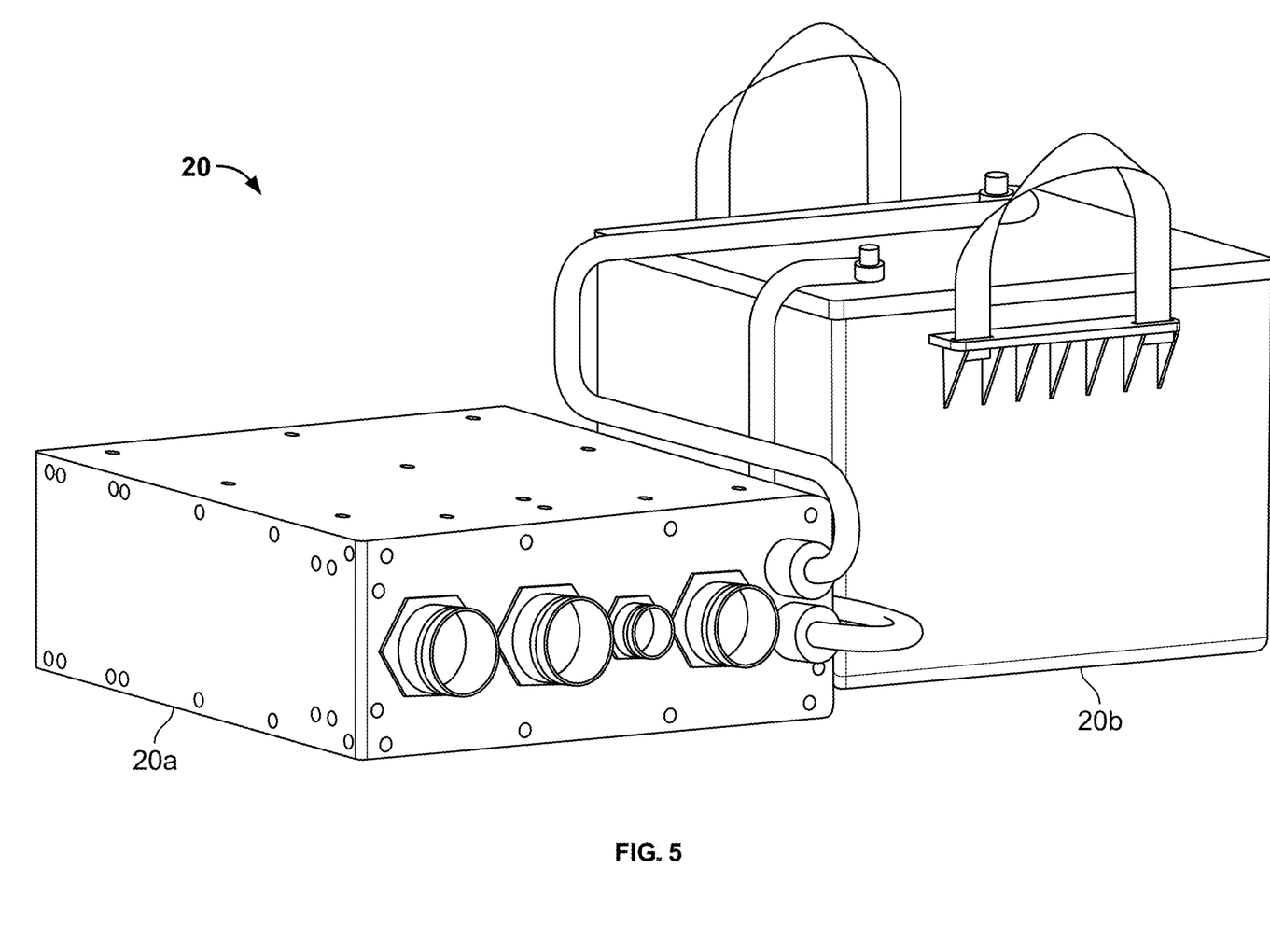
FIG. 5 is a diagram showing batteries and a power module.

Referring now to FIG. 5, the power module 20 is shown as including the battery 20*a* and the power converter 20*b* that provide electrical power required to run the DES 10. The battery 20*a* and the converter 20*b* are housed separately for maximum modularity. A plurality of the batteries and power converters can be used.

Directed Energy Systems

Conventional directed energy systems such as high energy laser systems, typically present a number of cooling challenges, including certain heat loads for which temperatures are maintained during operation within a relatively narrow range. A seed laser 11*a* in the command and control case 11 provides an initial optical signal. This initial optical signal is conditioned through delay lines, pre-amplifiers and other components, e.g., splitters, phase shifters, variable delay lines, etc. before reaching the high-power fiber amplifiers.

Uncooled

The DES operates according to a run-time process that allows the DES 10 to be operated "uncooled," i.e., without the use of any external cooling system, other release of heat to the ambient. The DES 10 can include sensors that sense temperature build-up. The subsystems self-protect—meaning each of the subsystems such as the fiber amplifiers, the batteries, the power converters, etc., shut down prior to reaching a critical temperature, a temperature which will cause a DES 10 failure. Overall, the DES 10 will monitor and protect for damage so as not to reach the critical temperature, allowing for graceful degradation of system performance without a thermal failure. Uncooled operation of the DES 10 avoids the use of a thermal management system, which could add substantial size/weight/volume and require substantial power to operate.

FIG. 6 shows one example of a portion of the DES 10, specifically, the high-power laser module 12 (or 12'). The high-power laser module 12 (or 12') includes a bank of one or more high-power laser diodes 12*a* and high-power fiber amplifiers 12*b* in a case 12*c* (or 12*c'* FIG. 2A) that are connected to the power source 20. During operation, high-power laser diodes 12*a* generate an output radiation beam 13 that is amplified by high-power fiber amplifiers 12*b*, and which are directed as a very high energy output beam 35 onto a target via the beam combiner 14 and beam director 16.

Generation of high energy output beams can result in the production of significant quantities of heat. Certain laser diodes, however, are relatively temperature sensitive, and the operating temperature of such diodes is regulated within a relatively narrow range of temperatures to ensure efficient operation and avoid thermal damage. Amplifiers are also temperature-sensitively, although typically less sensitive than diodes.

To regulate the temperatures of various components of the DES 10, especially the fiber amplifiers 12*b*, the cases 12*c* include sensors that sense temperature approaching critical temperatures that when reached cause the DES 10 to degrade towards "standby" or towards "shut down."

Figure 7:
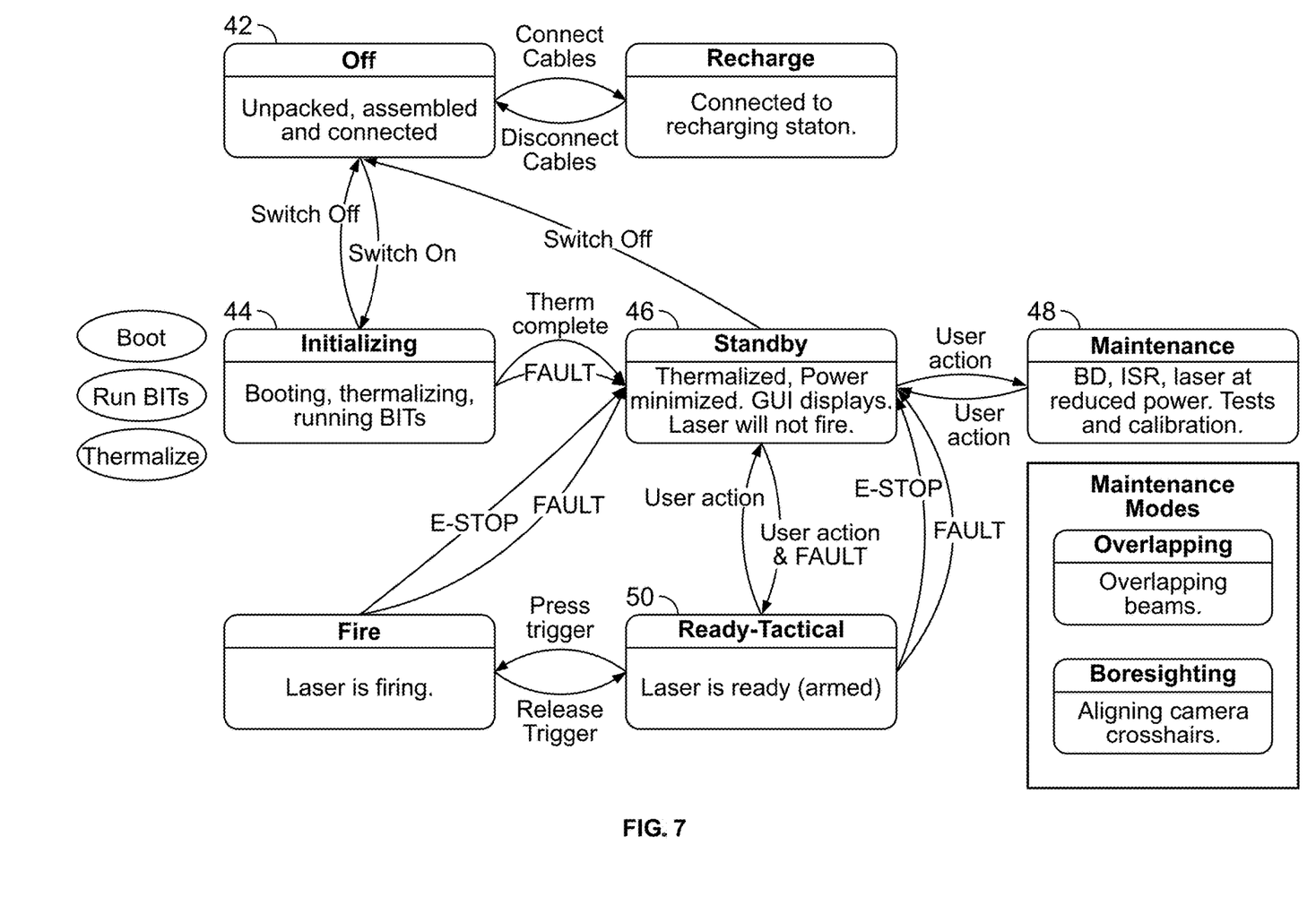
FIG. 7 is a flow diagram showing actions for controlling the plural high-power laser sources.

Referring now to FIG. 7, the DES 10 operates as follows: Initially, DES 10 is in component parts and the users unpack and connect the appropriate cables to the ruggedized case 11 and one or more of the laser modules 12 (or 12') 42. In addition, cables are connected to the yoke 29, and the beam combiner 14 and beam director 16 are coupled together.

The user turns on a power button on the command and control module 11 that sends a message to the ruggedized handheld controller 18 causing a system initialization 44, which involves booting the command and control module 11 and the ruggedized handheld controller 18, measuring thermal properties of the system, and running various built-in tests. When completed, the command and control module 11 enters a standby state 46, where the laser does not fire. From the standby state 46, the command and control module 11 can enter a maintenance mode 48, as well as a ready-tactical mode 50. In the maintenance mode various adjustments of the DES 10 can be performed, e.g., alignment of camera, search for system faults, etc.

When a fault is not detected, the DES 10 upon receiving a signal from the ruggedized handheld controller 18 enters a ready tactical mode 50. In the ready tactical mode 50, the laser is readied, e.g., armed, awaiting a firing command. Upon assertion of the firing command, the low-power seed laser source 11*a* emits a laser beam that is coupled to the high-power laser diodes 12*a* and amplified by the high-power fiber amplifiers 12*b* in laser modules 12 (or 12'), producing an output beam. The output beam is combined by the laser combiner 14 and focused on a target by the beam director 16. The output beam is maintained on the target until the user commands output off or a fault is detected. When the user commands the system to stop firing or a fault is detected, the firing command is rescinded, causing the DES 10 to return to standby 46, the low-power seed laser source 11*a* to turn off, and the banks of the high-power laser diodes 12*a* and the high-power fiber amplifiers 12*b* to release heat to the ambient, but without any external coolant medium, other that ambient air on the cases 12*c* causing the release of heat.

Other periods of time that are shorter than 1 minute could be used. With modifications to the cases 12*c* longer periods of time that are greater than 1 minute could be used, as well. In DES 10, each subsystem is configured to monitor for temperature faults (or other faults) and thus self protects. When a fault is detected, the fault is reported to the handheld controller 18 and the user can assess the nature of the fault, correct the fault, if possible in the field, and if corrected return to operation. If the fault is not correctable in the field, the system is turned off, e.g., by the command and control module 11 and/or the user operating the handheld controller 18.

The DES 10 allow for a 10 kW (nominally) laser system to be easily transported in a commercial pickup truck, for example, packed up or unpacked by only two end-users, and easily assembled for use even in low light conditions. The DES 10 has a minimal number of individual cases (generally) and allows even the heaviest of cases (generally) to be carried up rough terrain or on a narrow staircase with two users. DES 10 is scalable up to a 30 kW+ laser system with additional banks of laser diodes 12*a* in additional pairs of fiber laser amplifiers 12*b* that are housed in additional cases 12*c*. A total of eight amplifiers 12*b* being packaged in four cases 12*c* provides an approximate 10 kW (nominally) output beam. The system may exceed a 10 kW output beam.

The DES 10 is scalable. For example, the DES 10 has the four ruggedized cases 12*c*, each of which is configured to accommodate a pair of fiber amplifiers 12*b*. The DES 10 system can scale up or down in power by adding or removing cases 12*c*. The power subsystem 20 includes mil-spec commercially available batteries and custom power converters that remain generally unpackaged to allow for ease of carry and to also accommodate quick swap-out or even for the ability to add batteries and power converters for system scalability. The laser array is also 'uncooled" and can be further disassembled for ease of movement. Ruggedized interconnects (uniquely keyed) are provided on the exterior of the cases 12*c* and the laser array to enable quicker connections even in low light conditions.

XII. Hardware and Software Implementations

Handheld controller 18 can generally be implemented as any one of a variety of different electrical or electronic computing or processing devices, and can perform any combination of the various steps discussed above to control various components of the disclosed thermal management systems. The handheld controller 18 is a standard Human Interface Device (HID) compliant controller. Included with the handheld controller 18 is a monitor, e.g., 6.4" monitor screen that has a connection back to the handheld controller 18 over a VGA cable. The user interface displayed on the handheld controller 18 is running on the computer in the command and control case 11. The monitor on the handheld controller 18 is used to display the interface to the user. When a button is pressed, this information is sent to the command and control case 11 and the appropriate actions are performed on the system software.

The command and control module 11 can generally, and optionally, include any one or more of a processor (or multiple processors), a memory, a storage device, and input/output device. Some or all of these components can be interconnected using a system bus. The processor is capable of processing instructions for execution. In some embodiments, the processor is a single-threaded processor. In certain embodiments, the processor is a multi-threaded processor. Typically, the processor is capable of processing instructions stored in the memory or on the storage device to display graphical information for a user interface on the input/output device, and to execute the various monitoring and control functions discussed above. Suitable processors for the systems disclosed herein include both general and special purpose microprocessors, and the sole processor or one of multiple processors of any kind of computer or computing device.

The memory stores information within the system, and can be a computer-readable medium, such as a volatile or non-volatile memory. The storage device can be capable of providing mass storage for the command and control module 11. In general, the storage device can include any non-transitory tangible media configured to store computer readable instructions. For example, the storage device can include a computer-readable medium and associated components, including: magnetic disks, such as internal hard disks and removable disks; magneto-optical disks; and optical disks. Storage devices suitable for tangibly embodying computer program instructions and data include all forms of non-volatile memory including by way of example, semiconductor memory devices, such as EPROM, EEPROM, and flash memory devices; magnetic disks such as internal hard disks and removable disks; magneto-optical disks; and CD-ROM and DVD-ROM disks. Processors and memory units of the systems disclosed herein can be supplemented by, or incorporated in, ASICs (application-specific integrated circuits).

The input/output device provides input/output operations for handheld controller 18, and can include a keyboard and/or pointing device. In some embodiments, the input/output device includes a display unit for displaying graphical user interfaces and system related information.

The features described herein, including components for performing various measurement, monitoring, control, and communication functions, can be implemented in digital electronic circuitry, or in computer hardware, firmware, or in combinations of them. Methods steps can be implemented in a computer program product tangibly embodied in an information carrier, e.g., in a machine-readable storage device, for execution by a programmable processor (e.g., of the handheld controller 18), and features can be performed by a programmable processor executing such a program of instructions to perform any of the steps and functions described above. Computer programs suitable for execution by one or more system processors include a set of instructions that can be used directly or indirectly, to cause a processor or other computing device executing the instructions to perform certain activities, including the various steps discussed above.

Computer programs suitable for use with the systems and methods disclosed herein can be written in any form of programming language, including compiled or interpreted languages, and can be deployed in any form, including as stand-alone programs or as modules, components, subroutines, or other units suitable for use in a computing environment.

In addition to one or more processors and/or computing components implemented as part of the handheld controller 18, the systems disclosed herein can include additional processors and/or computing components within any of the system components and any of the sensors discussed above. Processors and/or computing components of the components and sensors, and software programs and instructions that are executed by such processors and/or computing components, can generally have any of the features discussed above in connection with the handheld controller 18.

Other Embodiments

A number of embodiments have been described. Nevertheless, it will be understood that various modifications may be made without departing from the spirit and scope of the disclosure. Accordingly, other embodiments are within the scope of the following claims.

What is claimed is:

1. A directed energy system (system) that has a compact and modular configuration and that enables movement/assembly by a two-user team, with the system comprising:
   one or more high-power laser modules that house one or more high-power fiber amplifiers;
   a beam combiner optically coupled to the one or more high-power laser modules;
   a beam director coupled to the beam combiner;
   a command and control module configurable to control operation of the one or more high-power laser diode banks and the one or more high-power fiber amplifiers;
   a handheld controller with an integrated monitor, the handheld controller configurable to send control signals to the command and control module to control operation of the command and control module; and a power module that includes batteries and power converters that provide electrical power required to run the directed energy system, wherein cooling of the directed energy system is performed only by ambient air contacting the directed energy system and without application of any external coolant medium to the system.

2. The system of claim 1 wherein pairs of the high-power fiber laser amplifiers are housed two high-power fiber amplifiers per high-power laser module.

3. The system of claim 1 wherein the one or more high-power laser modules include four high-power laser modules with a total of eight high-power fiber amplifiers packaged in four cases.

4. The system of claim 1 wherein the one or more high-power laser modules include output optical fibers that optically couple the one or more high-power laser modules into the beam combiner.

5. The system of claim 1 wherein the beam combiner is coupled to the beam director.

6. The system of claim 1 wherein the beam combiner and the beam director are packaged as a phased array beam director that moves in azimuth and elevation, and that includes sensors for a camera and a range finder supported on a yoke and a tripod.

7. The system of claim 1 wherein the command and control module further comprises:
a computer device;
a low-power seed laser; and
a power distribution network.

8. The system of claim 7 wherein the computer device causes the system to operate at a high-power output for a fixed interval of time, and then transitions to a standby mode, upon receipt of a user command.

9. The system of claim 7 wherein the computer device causes the system to operate at a high-power output and then transitions to a standby mode, upon receiving a fault signal to halt high-power operation.

10. The system of claim 1 wherein the system comprises a solid state fiber laser, and which system is configured to output an output beam of up to 10 kW.

11. A method of cooling a directed energy system (system) that has a compact and modular configuration and that enables movement/assembly by a two-user team, with the method comprising:

assembling one or more high-power laser modules that house one or more high-power fiber amplifiers, with a beam combiner that optically couples to the one or more high-power laser modules, that are arranged on a beam director that is coupled to the beam combiner with a command and control module and a power module that includes batteries and power converters that provide electrical power required to run the directed energy system;

controlling operation of the one or more high-power fiber amplifiers with a handheld controller having an integrated monitor, the handheld controller configurable to send control signals to the command and control module to control operation of the command and control module; and cooling the directed energy system only by ambient air contacting the directed energy system, without application of any external coolant medium to the system.

12. The method of claim 11 wherein the one or more high-power laser modules includes a pair of the high-power fiber laser amplifiers that are housed two high-power fiber amplifiers per high-power laser module.

13. The method of claim 11 wherein the one or more high-power laser modules are four high-power laser modules with a total of eight fiber laser amplifiers packaged in four cases.

14. The method of claim 11, further comprising:
optically coupling the one or more high-power laser modules into the beam combiner.

15. The method of claim 11, further comprising:
moving the beam director in azimuth and elevation.

16. The method of claim 11, further comprising:
causing by the handheld controller, operation at a high-power output; and
transitioning to a standby mode.

17. The method of claim 11, further comprising:
causing by the handheld controller, operation at a high-power output; and
transitioning to a standby mode, upon receiving a signal to halt high-power operation.

18. The method of claim 11 wherein the method further comprises:
outputting a 10 kW output beam from the beam director.

* * * * *